US012720991B2

(12) United States Patent
Jung et al.

(10) Patent No.: US 12,720,991 B2
(45) Date of Patent: Aug. 25, 2026

(54) LIGHT EMITTING DISPLAY DEVICE

(71) Applicant: LG Display Co., Ltd., Seoul (KR)

(72) Inventors: Nack Youn Jung, Paju-si (KR); Hong-Seok Choi, Paju-si (KR); Eun-Jung Park, Paju-si (KR); Min Soo Kang, Paju-si (KR); Jang Dae Youn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 531 days.

(21) Appl. No.: 18/063,283

(22) Filed: Dec. 8, 2022

(65) Prior Publication Data

US 2023/0217764 A1 Jul. 6, 2023

(30) Foreign Application Priority Data

Dec. 31, 2021 (KR) ........................ 10-2021-0194728

(51) Int. Cl.

*H10K 59/35* (2023.01)
*H10K 50/13* (2023.01)
*H10K 59/38* (2023.01)

(52) U.S. Cl.

CPC ........... *H10K 59/351* (2023.02); *H10K 50/13* (2023.02); *H10K 59/353* (2023.02); *H10K 59/38* (2023.02)

(58) Field of Classification Search

CPC .... H10K 59/351; H10K 50/13; H10K 59/353; H10K 59/38; H10K 59/32; H10K 59/8051; H10K 59/12; H10K 2102/351; H10K 50/805; H10K 59/35

See application file for complete search history.

(56) References Cited

U.S. PATENT DOCUMENTS

2013/0082589 A1* 4/2013 So ........................ H10K 59/351 313/504
2014/0183499 A1* 7/2014 Kim ....................... H10K 71/00 438/35
2015/0060812 A1* 3/2015 Kim ....................... H10K 59/32 257/40
2018/0219051 A1* 8/2018 Ghosh .................... H10K 59/38
(Continued)

FOREIGN PATENT DOCUMENTS

CN 113130542 A 7/2021
KR 20150015647 A 2/2015
(Continued)

*Primary Examiner* — Steven B Gauthier
*Assistant Examiner* — Alvin L Lee
(74) *Attorney, Agent, or Firm* — Seed Intellectual Property Law Group LLP

(57) ABSTRACT

Disclosed is a light emitting display device including a substrate having first to fourth subpixels, first to fourth anodes provided respectively on the first to fourth subpixels, an emission unit provided on the first to fourth anodes, the emission unit including two or more blue stacks and a phosphorescent stack including at least a yellowish green emission layer and a green emission layer, a cathode provided on the emission unit, a red filter and a color conversion layer provided between the substrate and the first anode, a green filter provided between the substrate and the second anode, and a blue filter provided between the substrate and the third anode, wherein the first anode has a first thickness, and at least one of the second to fourth anodes has a second thickness greater than the thickness of the first anode.

17 Claims, 5 Drawing Sheets

(56) References Cited

U.S. PATENT DOCUMENTS

| | | | | |
|---|---|---|---|---|
| 2019/0198573 | A1* | 6/2019 | Kim | H10K 59/8792 |
| 2020/0161580 | A1 | 5/2020 | Song et al. | |
| 2021/0202598 | A1 | 7/2021 | Han et al. | |
| 2021/0202607 | A1 | 7/2021 | Lee et al. | |
| 2021/0408137 | A1 | 12/2021 | Lee et al. | |

FOREIGN PATENT DOCUMENTS

| | | | | | |
|---|---|---|---|---|---|
| KR | 101723880 | B1 | | 4/2017 | |
| KR | 20180062232 | A | * | 6/2018 | H10K 59/123 |
| KR | 20180078641 | A | * | 7/2018 | |
| KR | 20190000759 | A | | 1/2019 | |
| KR | 20190069940 | A | | 6/2019 | |
| KR | 20200023863 | A | * | 3/2020 | H01L 51/5024 |
| KR | 102113609 | B1 | | 5/2020 | |
| KR | 102126350 | B1 | * | 6/2020 | H10K 59/38 |
| KR | 20210083972 | A | | 7/2021 | |

* cited by examiner

LIGHT EMITTING DISPLAY DEVICE

CROSS-REFERENCE TO RELATED APPLICATION(S)

This application claims the benefit of Korean Patent Application No. 10-2021-0194728, filed on Dec. 31, 2021, which is hereby incorporated by reference as if fully set forth herein.

TECHNICAL FIELD

The present disclosure relates to a display device, and more particularly to a light emitting display device configured such that the wavelength of an insufficient color of a tandem element is extracted through a lower complex structure, whereby both pure color and white efficiencies are improved.

DESCRIPTION OF THE RELATED ART

In recent years, a light emitting display device having a self-emissive element in a display panel has been considered as a competitive application in order to achieve compaction of the device and vivid color display without necessity of a separate light source.

Meanwhile, in recent years, higher efficiency in providing image quality has been beneficial for a light emitting element used in a light emitting display device. Particularly, in order to improve white efficiency, external quantum efficiency is increased or maximized, which is advantageous to luminance. In order to improve external quantum efficiency of white light, it is advantageous to mainly emit green light or yellowish green light. In this case, however, pure color luminance of red light is reduced.

BRIEF SUMMARY

Accordingly, the present disclosure is directed to a light emitting display device that substantially obviates one or more problems due to limitations and disadvantages of the related art.

It is a technical benefit of the present disclosure to provide a light emitting display device configured such that a light emitting element and a lower structure of an exit unit are changed, whereby pure color efficiencies of white light, red light, green light, and blue light are improved, and further color gamut is improved.

In a light emitting display device according to the present disclosure, a color conversion layer and a color filter may be selectively used in order to improve white luminance through a light emitting element and to acquire exit efficiency of insufficient red light in a lower structure of the light emitting element.

To achieve these technical benefits and other advantages and in accordance with the purpose of the embodiments, as broadly described herein, a light emitting display device includes a substrate having a first subpixel, a second subpixel, a third subpixel and a fourth subpixel, a first anode on the first subpixel, a second anode on the second subpixel, a third anode on the third subpixel, and a fourth anode on the fourth subpixel, an emission structure provided on the first, second, third and fourth anodes, the emission structure including two or more blue stacks and a phosphorescent stack including at least a yellowish green emission layer and a green emission layer, a cathode provided on the emission structure, a red filter and a color conversion layer provided between the substrate and the first anode, a green filter provided between the substrate and the second anode, and a blue filter provided between the substrate and the third anode, wherein the first anode has a first thickness, and at least one of the second, third and fourth anodes has a second thickness greater than the thickness of the first anode.

In another aspect of the present disclosure, a light emitting display device includes a substrate having a first subpixel, a second subpixel, a third subpixel and a fourth subpixel, a first anode on the first subpixel, a second anode on the second subpixel, a third anode on the third subpixel, and a fourth anode on the fourth subpixel, an emission structure provided on the first, second, third and fourth anodes, the emission structure including two or more blue stacks and a phosphorescent stack including a red emission layer, a yellowish green emission layer and a green emission layer, a cathode provided on the emission structure, a red filter and a color conversion layer provided between the substrate and the first anode, a green filter provided between the substrate and the second anode, and a blue filter provided between the substrate and the third anode, wherein the first anode has a first thickness, at least one of the second, third and fourth anodes has a second thickness greater than the thickness of the first anode, and the red emission layer is thinner than each of the yellowish green emission layer and the green emission layer in the phosphorescent stack.

It is to be understood that both the foregoing general description and the following detailed description of the present disclosure are examples and explanatory and are intended to provide further explanation of the embodiments as claimed.

BRIEF DESCRIPTION OF THE SEVERAL VIEWS OF THE DRAWINGS

The accompanying drawings, which are included to provide a further understanding of the embodiments and are incorporated in and constitute a part of this application, illustrate embodiment(s) and together with the description serve to explain the principle of the embodiments. In the drawings.

DETAILED DESCRIPTION

Figure 1:
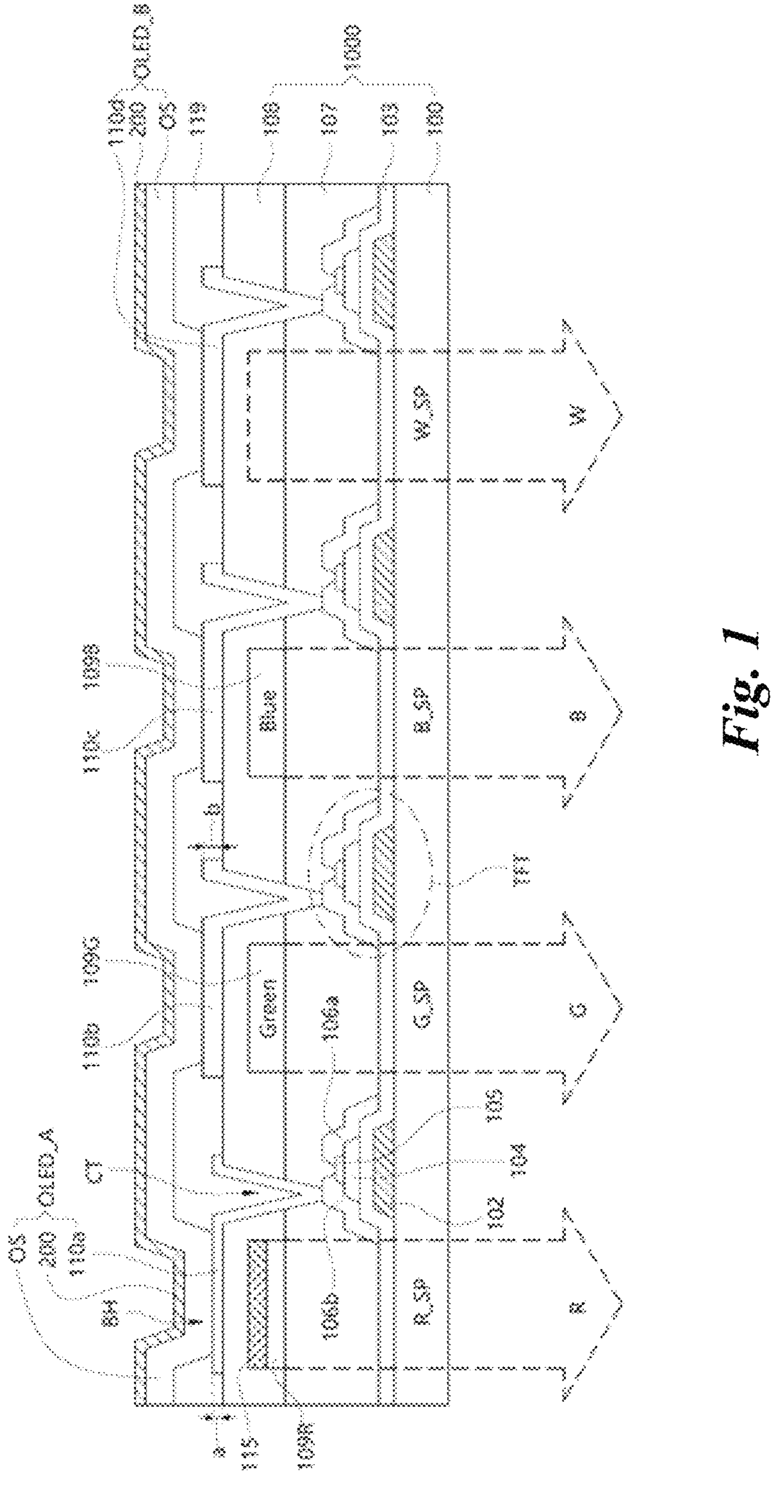
FIG. 1 is a sectional view showing a light emitting display device according to the present disclosure.

Reference will now be made in detail to embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clarity of description of the specification, and may differ from the names of elements of actual products.

The shape, size, ratio, angle, number, and the like shown in the drawings to illustrate various embodiments of the present disclosure are merely provided for illustration, and the disclosure is not limited to the content shown in the drawings. Wherever possible, the same reference numbers will be used throughout the drawings to refer to the same or like parts. In the following description, detailed descriptions of technologies or configurations related to the present disclosure may be omitted so as to avoid unnecessarily obscuring the subject matter of the present disclosure. When terms such as "including," "having," and "comprising" are used throughout the specification, an additional component may be present, unless "only" is used. A component described in a singular form encompasses a plurality thereof unless particularly stated otherwise.

The components included in the embodiments of the present disclosure should be interpreted to include an error range, even if there is no additional particular description thereof.

In describing the variety of embodiments of the present disclosure, when terms describing positional relationships such as "on," "above," "under" and "next to" are used, at least one intervening element may be present between the two elements, unless "immediately" or "directly" is used.

In describing the variety of embodiments of the present disclosure, when terms related to temporal relationships, such as "after," "subsequently," "next" and "before," are used, the non-continuous case may be included, unless "immediately" or "directly" is used.

In describing the variety of embodiments of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

As used herein, the term "doped" means that, in a material that accounts for most of the weight of a layer, a material (for example, N-type and P-type materials, or organic and inorganic substances) having physical properties different from the material that occupies most of the weight ratio of the layer is added in an amount less than 30% by weight. In other words, the "doped" layer refers to a layer that is used to distinguish a host material from a dopant material of a certain layer, in consideration of the specific gravity of the weight ratio. Also, the term "undoped" refers to any case other than the "doped" case. For example, when a layer contains a single material or a mixture of materials having the same properties as each other, the layer is included in the "undoped" layer. For example, if at least one of the materials constituting a certain layer is P-type and not all materials constituting the layer are N-type, the layer is included in the "undoped" layer. For example, if at least one of materials constituting a layer is an organic material and not all materials constituting the layer are inorganic materials, the layer is included in the "undoped" layer. For example, when all materials constituting a certain layer are organic materials, at least one of the materials constituting the layer is N-type and the other is P-type, when the N-type material is present in an amount of less than 30 wt %, or when the P-type material is present in an amount of less than 30 wt %, the layer is included in the "doped" layer.

Hereinafter, a light emitting display device according to the present disclosure will be described with reference to the accompanying drawings.

FIG. 1 is a sectional view showing a light emitting display device according to the present disclosure.

As shown in FIG. 1, a light emitting display device according to an embodiment of the present disclosure includes a substrate 100 having first to fourth subpixels R_SP, G_SP, B_SP, and W_SP, first to fourth anodes 110*a*, 110*b*, 110*c*, and 110*d* provided respectively on the first to fourth subpixels R_SP, G_SP, B_SP, and W_SP, an emission unit or structure OS provided on the first to fourth anodes 110*a*, 110*b*, 110*c*, and 110*d*, a cathode 200 provided on the emission unit OS. Further, the light emitting display device according to an embodiment of the present disclosure further includes a red filter 109R provided between the substrate 100 and the first anode 110*a*, a green filter 109G provided between the substrate 100 and the second anode 110*b*, and a blue filter 109B provided between the substrate 100 and the third anode 110*c*. Moreover, the light emitting display device according to an embodiment of the present disclosure further includes a color conversion layer 115 provided between the substrate 100 and the first anode 110*a*. The first to fourth subpixels R_SP, G_SP, B_SP, and W_SP may be called respectively as a red subpixel, a green subpixel, a blue subpixel and a white subpixel.

The first anode 110*a* located at the first subpixel R_SP may have a first thickness a, and at least one of the second to fourth anodes 110*b*, 110*c*, and 110*d* provided respectively at the second to fourth subpixels G_SP, B_SP, and W_SP may have a second thickness b greater than the thickness of the first anode 110*a* (b>a).

For example, the first anode 110*a*, which has a small thickness, the emission unit OS, and the cathode 200 formed on the first subpixel R_SP may constitute a first light emitting element OLED_A. Each of the second to fourth anodes 110*b*, 110*c*, and 110*d*, the emission unit OS, and the cathode 200 formed thereon may constitute a second light emitting element OLED_B, wherein each of the second to fourth anodes 110*b*, 110*c*, and 110*d* has a relatively large thickness. In the example shown, the second to fourth anodes 110*b*, 110*c*, and 110*d* are thicker than the first anode 110*a*. However, the present disclosure is not limited thereto. For example, each of the first subpixel R_SP and the third subpixel B_SP may have an anode having a small thickness, and each of the other anodes may have an anode having a large thickness.

Another subpixel having an anode having a small thickness, as in the first subpixel R_SP, may be provided thereunder with a color conversion layer configured to convert the color of light into a color of light to be emitted from the subpixel together with the color filter. For example, the color filter may include the red filter 109R, the green filter 109G, and the blue filter 109B.

That is, in the light emitting display device according to the present disclosure, the thicknesses of the anodes 110*a* to 110*d* are different from each other for the respective subpixels, whereby efficiency of light emitted from the light emitting element OLED is improved.

In particular, when light emitted from the first subpixel R_SP, among light emitted from the first light emitting element OLED_A, is insufficient, as shown in FIG. 1, the first subpixel R_SP having the first thickness a, which is small, may be provided with a color conversion layer 115, whereby white light emitted from the first light emitting element OLED_A may be converted into light having a wavelength band to be emitted, and finally the light may be selectively transmitted through the red filter 109R.

Meanwhile, a thin film transistor TFT may be provided on each of the subpixels R_SP, G_SP, B_SP, and W_SP on the substrate 100, whereby the light emitting elements may be selectively driven.

As an example, the thin film transistor TFT includes a gate electrode 102, a semiconductor layer 104 overlapping the gate electrode 102, and a source electrode 106*a* and a drain electrode 106*b* located at opposite sides of the semiconductor layer 104.

The semiconductor layer 104 may be made of at least one of polysilicon, an oxide semiconductor, and amorphous silicon.

In addition, an etching prevention layer 105 may be further provided between the semiconductor layer 104 and the source electrode 106*a* and the drain electrode 106*b* in order to protect a channel region of the semiconductor layer 104.

In addition, a passivation film 107 is formed so as to cover the thin film transistor TFT, and red filter 109R, green filter 109G, and blue filter 109B are formed on the surface of the passivation film 107 so as to correspond respectively to the first to third subpixels R_SP, G_SP, and B_SP.

In addition, at the first subpixel R_SP, a color conversion layer 115 is further formed on the red filter 109R to convert light emitted from the first light emitting element OLED_A into red right, which is emitted through the red filter 109R.

For example, the color conversion layer 115 performs a function of receiving light, converting the light into light having a changed wavelength, and transmitting the light having the changed wavelength, like a fluorescent dye or quantum dots. In the example shown, the wavelength of light emitted from the emission unit OS is biased to, particularly, blue, yellowish green, and green in order to improve white efficiency. In this case, the color conversion layer 115 converts light emitted from the emission unit OS into red light having a longer wavelength than the light, and emits the red light outside.

For example, when the anode 110*b* or 110*c* provided at the second subpixel G_SP or the third subpixel B_SP is thinner, a color conversion layer may be provided thereunder in order to convert light into light having a wavelength beneficial for the subpixel and to emit the light outside.

Meanwhile, the red filter 109R may have a smaller thickness than each of the green filter 109G and the blue filter 109B.

The distances from the upper parts of the first to fourth anodes 110*a*, 110*b*, 110*c*, and 110*d* to the cathode 200 may be equal to each other.

An overcoat layer 108 may be formed on the green filter 109G, the blue filter 109B, and the color conversion layer 115 to planarize a step of the surface.

After formation of the overcoat layer 108, the overcoat layer 108 and the passivation film 107 are selectively removed to form a contact hole CT, through which the drain electrode 106*b* of the thin film transistor TFT is exposed.

After formation of the contact hole CT, an anode material is formed and patterned on the contact hole CT and the overcoat layer 108 to form first to fourth anodes 110*a*, 110*b*, 110*c*, and 110*d* so as to be connected respectively to the drain electrodes 106*b* at the subpixels R_SP, G_SP, B_SP, and W_SP. In order to provide a step between the first to fourth anodes 110*a*, 110*b*, 110*c*, and 110*d*, an additional etching process may be further performed with respect to an anode beneficial to have a small thickness.

At the anodes 110*a* to 110*d*, the difference between the first thickness a, which is small, and the second thickness b, which is large, may be 800 Å or more.

In addition, a bank 119 is formed so as to expose emission portions while covering edges of the first to fourth anodes 110*a*, 110*b*, 110*c*, and 110*d*.

Subsequently, the emission unit OS and the cathode 200 are formed on the bank 119 and the anodes 110*a*, 110*b*, 110*c*, and 110*d*.

In the present disclosure, the emission unit OS may include a plurality of stacks, which will be described hereinafter in detail with reference to the drawings.

Figure 2:
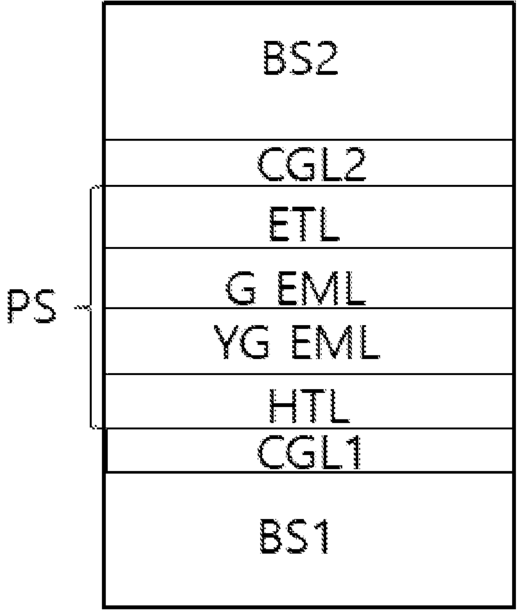
FIG. 2 is a sectional view showing a first embodiment of a light emitting element of FIG. 1.
Figure 3:
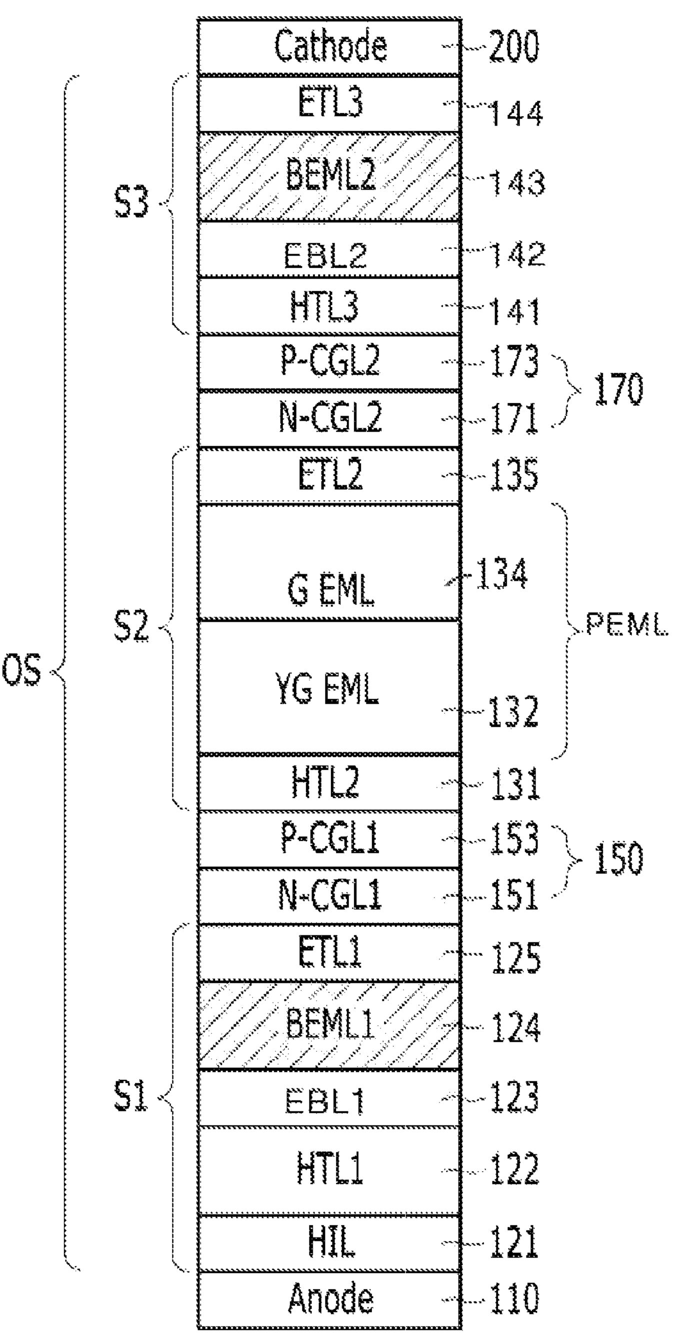
FIG. 3 is a sectional view specifically showing stacks of FIG. 2.

FIG. 2 is a sectional view showing a first embodiment of the light emitting element of FIG. 1, and FIG. 3 is a sectional view specifically showing stacks of FIG. 2.

The light emitting element shown in FIGS. 2 and 3 includes three stacks provided between the anodes 110 (110*a* to 110*d*) and the cathode 200, and the stacks include a first blue stack BS1 (S1 in FIG. 3) abutting the anodes 110*a* to 110*d*, a phosphorescent stack PS (in FIG. 2) including at least a yellowish green emission layer YG EML and a green emission layer G EML, and a second blue stack BS2 (S3 in FIG. 3). Each sub-pixel includes an emission unit OS to emit a white light between the anode 110 and the cathode 200.

The yellowish green emission layer may have an emission peak at a wavelength of 550 nm to 590 nm, and the green emission layer may have an emission peak at a wavelength of 510 nm to 545 nm.

A first charge generation layer CGL1 150 and a second charge generation layer CGL2 170 may be provided between the respective stacks BS1, PS, and BS2 to supply holes and electrons to stacks adjacent thereto. The charge generation layers CGL1 150 and CGL2 170 may include an n-type charge generation layer N-CGL1 151, N-CGL2 171 to generate electrons, and the p-type charge generation layer P-CGL1 153, P-CGL2 173 to generate holes.

In FIG. 3, it is shown that the first stack S1 includes the first blue stack BS1, the second stack S2 includes the phosphorescent stack PS and the third stack S3 includes the second blue stack BS2.

Meanwhile, in the light emitting element shown in FIGS. 2 and 3, the phosphorescent stack PS includes a hole transport layer HTL, a yellowish green emission layer YG EML, a green emission layer G EML, and an electron transport layer ETL. The yellow green emission layer YG EML 132, the green emission layer G EML 134 constitute a phosphorescent emitting layers PEML.

In the light emitting element according to the first embodiment, the phosphorescent stack PS includes no red emission layer.

On the assumption that similar excitons are formed in the phosphorescent stack PS, when only the yellowish green emission layer and the green emission layer are provided, efficiency of the light emitting element according to the first embodiment is high at the time of white implementation. Since no red emission peak occurs, however, luminance or color gamut may be reduced in pure red color.

When the light emitting display device according to the present disclosure includes only the light emitting element according to the first embodiment, efficiency is improved; however, the red color has difficulty satisfying DCI ("Digital Cinema Initiative"), which is one of color gamut standards, since there is no red peak. In addition, it is difficult to emit sufficient red light from the light emitting element according to the first embodiment of the present disclosure outside with only the differential thickness of the anode. In the light emitting element according to the present disclosure, as shown in FIG. 1, the color conversion layer 115 may be further provided on the red filter 109R at the first subpixel R_SP in order to convert light into red light and to emit the red light outside. When the color conversion layer 115 is applied, therefore, it is possible to improve pure color luminance insufficient in the light emitting element.

Meanwhile, more specifically, the light emitting element according to the first embodiment is configured as follows.

That is, an emission unit OS including a first blue unit or structure BS1, a first charge generation layer CGL1, a phosphorescent stack PS, a second charge generation layer CGL2, and a second blue unit or structure BS2 is formed on the anodes 110*a* to 110*d*.

The first blue unit BS1 (S1) may include a first blue emission layer BEML1, a hole injection layer HIL 121, a first hole transport layer HTL1 122 and a first exciton blocking layer EBL1 123 as a first common layer thereunder, and a first electron transport layer ETL1 125 as a second common layer thereon.

The phosphorescent stack PS (S2) may include a second hole transport layer HTL2 131 as a third common layer, a yellowish green emission layer YG EML, a green emission layer G EML, and a second electron transport layer ETL2 135 as a fourth common layer.

Similarly to the first blue unit BS1 (S1), the second blue unit BS2 (S3) may include a second blue emission layer BEML2, a third hole transport layer HTL3 141 and a second exciton blocking layer EBL2 142 as a fifth common layer thereunder, and a third electron transport layer ETL3 144 as a sixth common layer thereon.

The first, third, and fifth common layers HIL 121/HTL1 122/EBL 123, HTL2 131, and HTL3 141, which are layers related to hole transport or hole injection or blocking excitons/electrons, may include a hole transport layer HTL, an electron blocking layer, and a hole control layer. The first common layer abutting the anode may be further provided with a hole injection layer HIL 121.

The second, fourth, and sixth common layers ETL1 125, ETL2 135, and ETL3 144, which are layers related to electron transport, may include an electron transport layer, a hole blocking layer, and an electron control layer. The sixth common layer ETL3 144 abutting the cathode 200 may be further provided with an electron injection layer on an electron transport layer.

When the phosphorescent stack PS of the emission unit OS has only a two-layered structure, the yellowish green emission layer YG EML and the green emission layer G EML may abut the hole transport layer HTL and the electron transport layer ETL, respectively, as common layers.

The yellowish green emission layer YG EML may have an emission peak at a wavelength of 550 nm to 590 nm, and the green emission layer G EML may have an emission peak at a wavelength of 510 nm to 545 nm.

The color conversion layer 115 may convert light generated from the emission unit OS into a red wavelength.

Each of the blue stacks BS1 and BS2 may have an emission peak of 430 nm to 470 nm.

The emission unit OS is commonly formed on the first to fourth subpixels R_SP, G_SP, B_SP, and W_SP without division. The emission unit OS is provided at all subpixels provided on the substrate 100, and therefore it is possible to form the emission unit using an open mask without a fine metal mask, whereby there is no burden on the process.

Meanwhile, the light emitting element applied to the light emitting display device according to the present disclosure may have a structure according to a second embodiment, a description of which will follow, as well as the structure according to the first embodiment shown in FIGS. 2 and 3.

Figure 4:
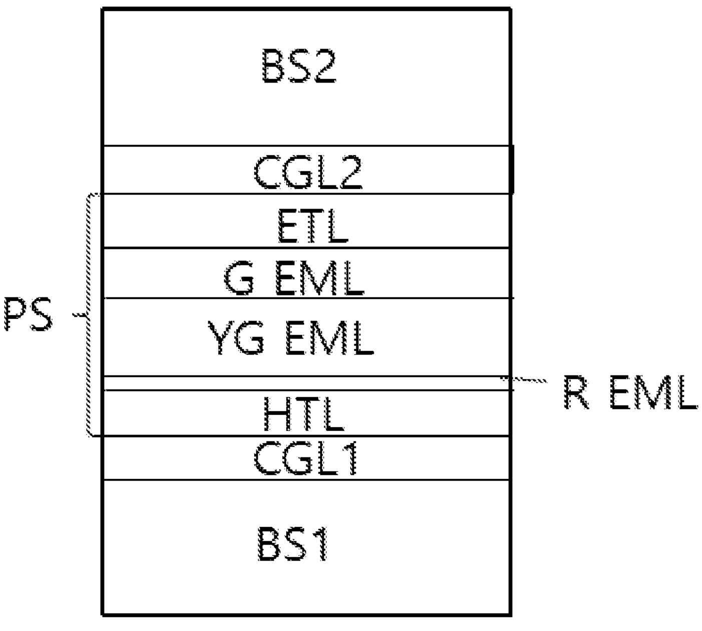
FIG. 4 is a sectional view showing a second embodiment of the light emitting element of FIG. 1.

FIG. 4 is a sectional view showing a second embodiment of the light emitting element of FIG. 1.

In the phosphorescent stack PS, a red emission layer R EML may be further provided under the yellowish green emission layer YG EML.

In this case, the red emission layer R EML may have a thickness equivalent to 0.3 or less times the total thickness of the emission layers R EML, YG EML, and G EM included in the phosphorescent stack PS.

The red emission layer may have an emission peak at a wavelength of 600 nm to 650 nm, the yellowish green emission layer may have an emission peak at a wavelength of 550 nm to 590 nm, and the green emission layer may have an emission peak at a wavelength of 510 nm to 545 nm.

In addition, the intensity of light emitted from the red emission layer R EML may be 50% or less the emission peak of the maximum intensity of light emitted from the phosphorescent stack PS. This will be described below with reference to a graph and a table.

Figure 5:
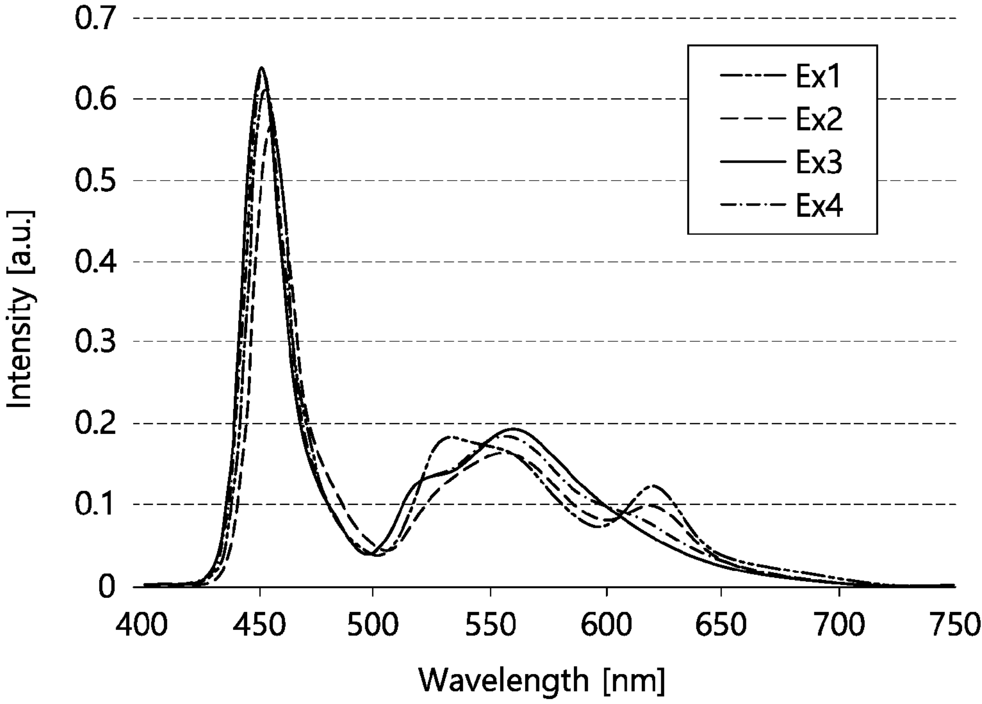
FIG. 5 is a graph showing white emission spectra according to first to fourth experimental examples.

FIG. 5 is a graph showing white emission spectra according to first to fourth experimental examples.

TABLE 1

| Element structure | Max peak of phosphorescence: Wave-length [nm] | Max peak of phosphorescence: Intensity | Red peak: Wave-length [nm] | Red peak: Intensity | Red intensity percentage |
|---|---|---|---|---|---|
| Ex1 (R/YG/G) [including R] | 532 | 0.183 | 620 | 0.122 | 67% |
| Ex2 (R/YG/G) [including R] | 560 | 0.161 | 620 | 0.099 | 62% |
| Ex3 (YG/G) | 560 | 0.193 | 620 | 0.061 | 32% |
| Ex4 (thin R/ YG/G) | 556 | 0.186 | 620 | 0.076 | 41% |

In the first experimental example (Ex1), the phosphorescent emission layer having the maximum peak in the phosphorescent stack is the red emission layer.

In the second experimental example (Ex2), the phosphorescent emission layer having the maximum peak in the phosphorescent stack is the yellowish green emission layer. In this case, in the first and second experimental examples (Ex1 and Ex2), the red emission layer, the yellowish green emission layer, and the green emission layer are sequentially deposited so as to have similar thicknesses, whereby full window luminance is achieved through balance among the emission layers. In contrast, in the light emitting element according to the first embodiment of the present disclosure described with reference to FIGS. 2 and 3, the phosphorescent stack is constituted by only the yellowish green emission layer and the green emission layer without the red emission layer. In this case, the result of the light emitting element according to the first embodiment is identical to the third experimental example (Ex3). In the light emitting element, the yellowish green emission layer has the maximum peak. As a result, intensity at a red wavelength of 620 nm is 0.061, which is 32% of the maximum intensity of the yellowish green emission layer having the maximum intensity in the phosphorescent stack, which is 0.193, whereby red purity efficiency in the light emitting element is reduced.

The result of the light emitting element according to the second embodiment is identical to the fourth experimental example (Ex4). Even when the red emission layer R EML is provided in the phosphorescent stack so as to have a small thickness, the maximum peak occurs at a wavelength of 556 nm in the yellowish green emission layer of the light emitting element. As a result, in the fourth experimental example (Ex4), the intensity at a red wavelength of 620 nm is 0.076, which is 41% of the maximum intensity, which is 0.186, compared to the intensity (0.193) of the wavelength peak of the yellowish green emission layer having the maximum intensity in the phosphorescent stack of the third experimental example (Ex3), whereby red purity efficiency in the light emitting element is reduced.

In the light emitting display device according to the present disclosure, therefore, exit efficiency of red light is improved under the anode due to differential thicknesses of the anode and by the provision of the red filter and the color conversion layer under the anode together with the light emitting element.

Hereinafter, efficiency, color coordinate characteristics, full window luminance, external quantum efficiency, and color gamut of the first to fourth experimental examples (Ex1 to Ex4) will be described.

In the Tables 2-3, the 'WCT' shows a full white luminance, when all of the red, green, blue and white sub-pixels area turned on for a white display. And in the Tables 2-3, the 'RGB' shows a full white luminance when pure color sub-pixels of the red, green, and blue sub-pixels are turned on for a white display.

In the Tables 2-3, the term of 'EQE' means an external quantum efficiency. The term of 'DCI' means a digital cinema initiative and is a kind of color gamut set forth by the Digital Cinema Initiatives organization.

TABLE 2

| Classification | | Light emitting element characteristics | | | |
|---|---|---|---|---|---|
| | | Ex1 | Ex2 | Ex3 | Ex4 |
| Efficiency (Cd/A) (@ full) | R | 10.36 | 8.99 | 7.31 | 8.10 |
| | W | 82.52 | 77.08 | 87.00 | 85.65 |
| Color coordinates | Rx | 0.679 | 0.681 | 0.671 | 0.675 |
| | Ry | 0.316 | 0.319 | 0.326 | 0.323 |
| F.W. luminance | WCT | 275 | 250 | 288 | 285 |
| | RGB | 275 | 254 | 208 | 228 |
| EQE (%) | | 45.1 | 41 | 44.7 | 44.8 |
| Color gamut (%) | DCI overlap ratio | 99.3 | 99.0 | 96.0 | 97.6 |

As shown in Table 2, it can be seen that, in the third experimental example (Ex3: corresponding to FIGS. 2 and 3) and the fourth experimental example (Ex4: corresponding to FIG. 4), the white efficiency improvement effect is great. However, no red light is emitted from the light emitting element, whereby RGB color purity and color coordinate characteristics are reduced. In addition, as shown in FIG. 5, it can be seen that the ratio of the peak of the red region to the intensity of the emission layer having the maximum peak in the phosphorescent stack is about 30 to 40%. 50% or less is meaningful.

TABLE 3

| Classification | | Application of differential anode | | Application of color conversion layer | | Differential anode + Color conversion layer | |
|---|---|---|---|---|---|---|---|
| | | Ex3-1 | Ex4-1 | Ex3-2 | Ex4-2 | Ex3-3 | Ex4-3 |
| Efficiency (Cd/A) (@ full) | R | 8.55 | 9.28 | 8.11 | 8.51 | 9.49 | 9.75 |
| | W | 87.00 | 85.65 | 87.00 | 85.65 | 87.00 | 85.65 |
| Color coordinates | Rx | 0.674 | 0.677 | 0.678 | 0.679 | 0.681 | 0.681 |
| | Ry | 0.325 | 0.322 | 0.325 | 0.322 | 0.319 | 0.319 |
| F.W. luminance | WCT | 289 | 286 | 288 | 285 | 292 | 287 |
| | RGB | 245 | 260 | 240 | 245 | 280 | 280 |
| EQE (%) | | 44.7 | 44.8 | 44.7 | 44.8 | 44.7 | 44.8 |
| Color gamut (%) | DCI overlap ratio (%) | 97.0 | 98.2 | 98.2 | 98.3 | 99.1 | 99.3 |

As shown in Table 3, in the 3-1 experimental example (Ex3-1) and the 4-1 experimental example (Ex4-1), in which the differential anode is further applied to the third and fourth experimental examples, RGB luminance characteristics are improved by about 17% and 15%. Since each light emitting element has almost no red peak, however, color gamut is low, and, when the color coordinates are shifted to a long wavelength by using a thick color filter, efficiency is reduced.

In the 3-2 experimental example (Ex3-2) and the 4-2 experimental example (Ex4-2), in which the color conversion layer is applied to the third and fourth experimental examples, RGB pure color luminance is low. Efficiency is similar to the 3-1 experimental example (Ex3-1) and the 4-1 experimental example (Ex4-1), in which the differential anode is further applied to the third and fourth experimental examples.

In the 3-1 experimental example (Ex3-1), the 4-1 experimental example (Ex4-1), the 3-2 experimental example (Ex3-2), and the 4-2 experimental example (Ex4-2), however, color gamut is low and there is a limitation in improving color coordinate characteristics, since each light emitting element has almost no red peak.

When both the differential anode and the color conversion layer are applied to the third and fourth experimental examples (Ex3-3 and Ex4-3), it can be seen that red characteristics can be secured, whereby color coordinate characteristics are improved and full window luminance is improved.

Figure 6:
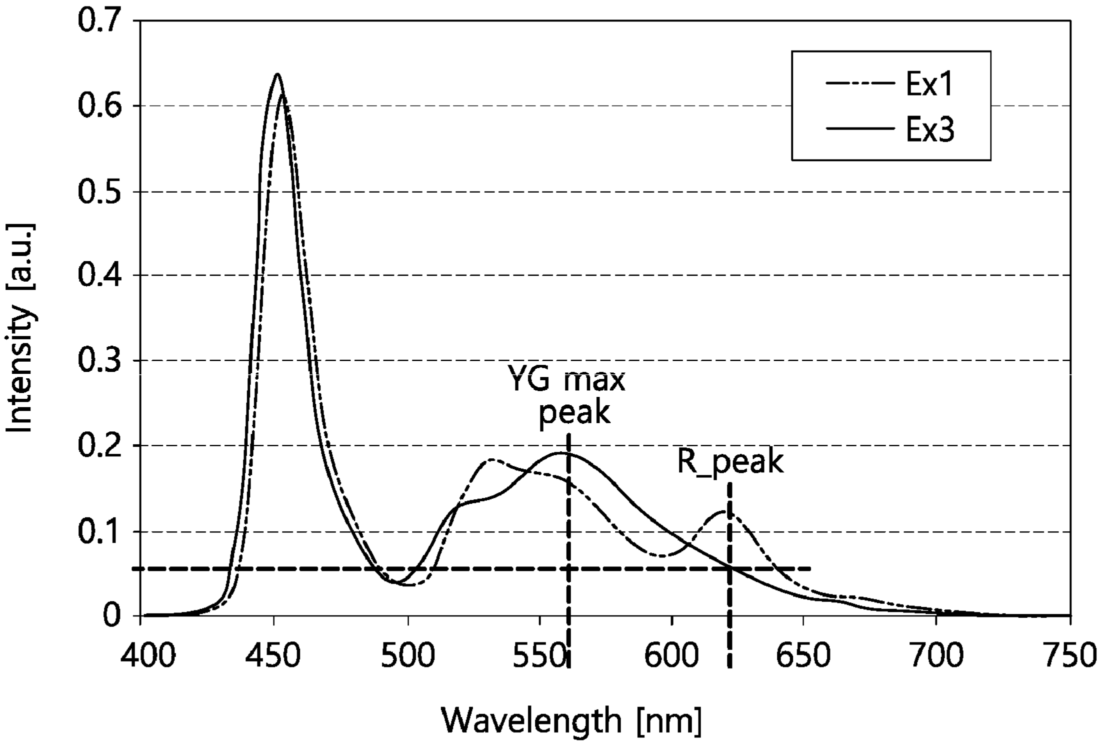
FIG. 6 is a graph showing the white emission spectra according to the first and third experimental examples for comparison.

FIG. 6 is a graph showing the white emission spectra according to the first and third experimental examples for comparison.

In the third experimental example (Ex3), the intensity of red light is about 32% of an emission peak having the maximum intensity of light emitted from the phosphorescent stack. In addition, referring to Table 1, it can be seen that, when the red emission layer is provided in the phosphorescent stack so as to have a small thickness, red efficiency is about 41% of luminance indicating the maximum intensity in the phosphorescent emission layer. That is, in the light emitting display device according to the present disclosure, when the differential anode and the color conversion layer are further provided to the structure of the first embodiment and the second embodiment, it is possible to secure red luminance within about 50% of luminance indicating the maximum intensity in the phosphorescent emission layer.

In the light emitting display device according to the present disclosure, the phosphorescent stack provided between the fluorescent stacks must exhibit the maximum external quantum efficiency, which is advantageous to luminance.

In white implementation, therefore, it is advantageous for the yellowish green emission layer and the green emission layer in the phosphorescent stack to mainly emit light. In the light emitting display device according to the present disclosure, the differential anode and the color conversion layer are provided so as to correspond to the red subpixel, whereby it is possible to improve only color purity of red light while improving white efficiency through the structure of the light emitting element. Consequently, it is possible to provide a light emitting display device with high luminance and improved color purity.

A light emitting display device according to an embodiment of a present disclosure may comprise a substrate having a first subpixel, a second subpixel, a third subpixel and a fourth subpixel, a first anode provided on the first subpixel, a second anode provided on the second subpixel, a third anode provided on the third subpixel, and a fourth anode provided on the fourth subpixel, an emission unit provided on the first to fourth anodes, the emission unit comprising two or more blue stacks and a phosphorescent stack comprising at least a yellowish green emission layer and a green emission layer, a cathode provided on the emission unit, a red filter and a color conversion layer provided between the substrate and the first anode, a green filter provided between the substrate and the second anode and a blue filter provided between the substrate and the third anode. The first anode has a first thickness, and at least one of the second to fourth anodes may have a second thickness greater than the thickness of the first anode.

In a light emitting display device according to an embodiment of a present disclosure, the two or more blue stacks may comprise a first blue stack and a second blue stack, and the first blue stack, the phosphorescent stack, and the second blue stack sequentially disposed from the first to fourth anodes, and the first blue stack abuts the first to fourth anodes.

In the phosphorescent stack of the emission unit, the yellowish green emission layer and the green emission layer may abut a hole transport layer and an electron transport layer, respectively.

A light emitting display device according to an embodiment of a present disclosure, the phosphorescent stack may further comprise a red emission layer under the yellowish green emission layer.

In a light emitting display device according to an embodiment of a present disclosure, the red emission layer may have a thickness equivalent to 0.3 or less times a total thickness of the emission layers included in the phosphorescent stack.

In a light emitting display device according to an embodiment of a present disclosure, an intensity of light emitted from the red emission layer may be 50% or less an emission peak of a maximum intensity of light emitted from the phosphorescent stack.

In a light emitting display device according to an embodiment of a present disclosure, the yellowish green emission layer may have an emission peak at a wavelength of 550 nm to 590 nm, and the green emission layer may have an emission peak at a wavelength of 510 nm to 545 nm.

A light emitting display device according to an embodiment of a present disclosure, the color conversion layer may convert light generated from the emission unit into a red wavelength.

In a light emitting display device according to an embodiment of a present disclosure, the red filter may have a smaller thickness than that of each of the green filter and the blue filter.

In a light emitting display device according to an embodiment of a present disclosure, a difference between the first thickness and the second thickness may be 800 Å or more.

In a light emitting display device according to an embodiment of a present disclosure, distances from upper parts of the first to fourth anodes to the cathode may be equal to each other.

In a light emitting display device according to an embodiment of a present disclosure, each of the two or more blue stacks has an emission peak of 430 nm to 470 nm.

A light emitting display device according to another embodiment of a present disclosure may comprise a substrate having a first subpixel, a second subpixel, a third subpixel and a fourth subpixel, a first anode provided on the first subpixel, a second anode provided on the second subpixel, a third anode provided on the third subpixel, and a fourth anode provided on the fourth subpixel, an emission unit provided on the first to fourth anodes, the emission unit comprising two or more blue stacks and a phosphorescent stack comprising a red emission layer, a yellowish green emission layer and a green emission layer, a cathode provided on the emission unit, a red filter and a color conversion layer provided between the substrate and the first anode, a green filter provided between the substrate and the second anode and a blue filter provided between the substrate and the third anode. The first anode has a first thickness, at least one of the second to fourth anodes may have a second thickness greater than the thickness of the first anode. The red emission layer may be thinner than each of the yellowish green emission layer and the green emission layer in the phosphorescent stack.

In a light emitting display device according to an embodiment of a present disclosure, an intensity of light emitted from the red emission layer may be 50% or less an emission peak of a maximum intensity of light emitted from the phosphorescent stack.

In a light emitting display device according to an embodiment of a present disclosure, the red emission layer may have an emission peak at a wavelength of 600 nm to 650 nm, the yellowish green emission layer may have an emission peak at a wavelength of 550 nm to 590 nm, and the green emission layer may have an emission peak at a wavelength of 510 nm to 545 nm.

A light emitting display device according to yet another embodiment of a present disclosure may comprise a substrate having a red subpixel, a green subpixel, a blue subpixel and a white subpixel; a first anode provided on the red subpixel, a second anode provided on the green subpixel, a third anode provided on the blue subpixel, and a fourth anode provided on the white subpixel; an emission unit provided on the first to fourth anodes, the emission unit comprising two or more blue stacks and a phosphorescent stack comprising at least a yellowish green emission layer and a green emission layer; a cathode provided on the emission unit; wherein the first anode has a first thickness, and at least one of the second to fourth anodes has a second thickness greater than the thickness of the first anode.

As is apparent from the above description, a light emitting display device according to the present disclosure has the following effects.

First, a red emission layer may be omitted from a phosphorescent stack or may be provided so as to have a small thickness, and a yellowish green emission layer and a green emission layer are provided in the phosphorescent stack, whereby it is possible to improve white efficiency while maximizing external quantum efficiency.

Second, an insufficient red efficiency problem may be solved by provision of both a color conversion layer and a color filter under an anode together with the thickness of the anode, whereby it is possible to obtain color purity of red light.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device comprising:

a substrate having a first subpixel, a second subpixel, a third subpixel and a fourth subpixel;

a first anode on the first subpixel, a second anode on the second subpixel, a third anode on the third subpixel, and a fourth anode on the fourth subpixel;

an emission structure on the first, second, third and fourth anodes, the emission structure including two or more blue stacks and a phosphorescent stack having at least a yellowish green emission layer and a green emission layer;

a cathode on the emission structure;

a red filter and a color conversion layer between the substrate and the first anode;

a green filter between the substrate and the second anode; and a blue filter provided between the substrate and the third anode, wherein the first anode has a first thickness, wherein at the first subpixel, a white light generated from the emission structure is transmitted to the first anode and converted into a red light through the color conversion layer, and the red light is emitted outside through the red filter and the substrate, and wherein each of the second, third, and fourth subpixels is not overlapped with a color conversion layer, and each of the second, third and fourth anodes has a second thickness greater than the first thickness of the first anode.

2. The light emitting display device according to claim 1, wherein the emission structure comprises a first blue stack, the phosphorescent stack, and a second blue stack sequentially disposed from the first, second, third and fourth anodes, and the first blue stack abuts the first, second, third and fourth anodes.

3. The light emitting display device according to claim 1, wherein, in the phosphorescent stack of the emission structure, the yellowish green emission layer abuts a hole transport layer and the green emission layer abuts an electron transport layer.

4. The light emitting display device according to claim 1, wherein the phosphorescent stack further comprises a red emission layer under the yellowish green emission layer.

5. The light emitting display device according to claim 4, wherein the red emission layer has a thickness equivalent to 0.3 or less times a total thickness of the yellowish green and green emission layers included in the phosphorescent stack.

6. The light emitting display device according to claim 4, wherein an intensity of light emitted from the red emission layer is 50% or less an emission peak of a maximum intensity of light emitted from the phosphorescent stack.

7. The light emitting display device according to claim 1, wherein the yellowish green emission layer has an emission peak at a wavelength of 550 nanometers (nm) to 590 nm, and the green emission layer has an emission peak at a wavelength of 510 nm to 545 nm.

8. The light emitting display device according to claim 1, wherein the red filter has a smaller thickness than that of each of the green filter and the blue filter.

9. The light emitting display device according to claim 1, wherein a difference between the first thickness and the second thickness is 800 Angstroms (Å) or more.

10. The light emitting display device according to claim 1, wherein distances from upper parts of the first, second, third and fourth anodes to the cathode are equal to each other.

11. The light emitting display device according to claim 1, wherein each of the two or more blue stacks has an emission peak of 430 nm to 470 nm.

12. The light emitting display device according to claim 1, wherein at the fourth subpixel, a white light generated from the emission structure is transmitted to the first anode and emitted out through the substrate.

13. A light emitting display device comprising:

a substrate having a first subpixel, a second subpixel, a third subpixel and a fourth subpixel;

a first anode on the first subpixel, a second anode on the second subpixel, a third anode on the third subpixel, and a fourth anode on the fourth subpixel;

an emission structure on the first to fourth anodes, the emission structure including two or more blue stacks and a phosphorescent stack having a red emission layer, a yellowish green emission layer and a green emission layer;

a cathode on the emission structure;

a red filter and a color conversion layer between the substrate and the first anode;

a green filter provided between the substrate and the second anode; and a blue filter between the substrate and the third anode, wherein the first anode has a first thickness, wherein the red emission layer is thinner than each of the yellowish green emission layer and the green emission layer in the phosphorescent stack, and wherein at the first subpixel, a white light generated from the emission structure is converted into a red light through the color conversion layer and the red light is emitted outside through the red filter, and wherein each of the second, third, and fourth subpixels is not overlapped with a color conversion layer, and each of the second, third and fourth anodes has a second thickness greater than the first thickness of the first anode.

14. The light emitting display device according to claim 13, wherein an intensity of light emitted from the red emission layer is 50% or less an emission peak of a maximum intensity of light emitted from the phosphorescent stack.

15. The light emitting display device according to claim 13, wherein the red emission layer has an emission peak at a wavelength of 600 nm to 650 nm, the yellowish green emission layer has an emission peak at a wavelength of 550 nm to 590 nm, and the green emission layer has an emission peak at a wavelength of 510 nm to 545 nm.

16. The light emitting display device according to claim 13, wherein, in the phosphorescent stack of the emission structure, the red emission layer abuts a hole transport layer and the green emission layer abuts an electron transport layer.

17. The light emitting display device according to claim 13, wherein at the fourth subpixel, a white light generated from the emission structure is transmitted to the first anode and emitted out through the substrate.

* * * * *